United States Patent
Wolf et al.

(10) Patent No.: US 8,120,325 B2
(45) Date of Patent: Feb. 21, 2012

(54) BATTERY SHORT CIRCUIT MONITORING

(75) Inventors: Mats Wolf, Sodra Sandby (SE); Jan-Olof Svensson, Kivik (SE)

(73) Assignee: Sony Ericsson Mobile Communications AB, Lund (SE)

( * ) Notice: Subject to any disclaimer, the term of this patent is extended or adjusted under 35 U.S.C. 154(b) by 977 days.

(21) Appl. No.: 11/851,684

(22) Filed: Sep. 7, 2007

(65) Prior Publication Data

US 2009/0039835 A1 Feb. 12, 2009

Related U.S. Application Data

(60) Provisional application No. 60/955,103, filed on Aug. 10, 2007.

(51) Int. Cl.
*H02J 7/00* (2006.01)
(52) U.S. Cl. .................................. 320/136; 320/153
(58) Field of Classification Search .............. 320/107, 320/134, 136, 150, 153, 162
See application file for complete search history.

(56) References Cited

U.S. PATENT DOCUMENTS

| 2003/0178970 | A1* | 9/2003 | Minamiura et al. | 320/116 |
| 2007/0120528 | A1* | 5/2007 | Burgan et al. | 320/114 |
| 2007/0244471 | A1* | 10/2007 | Malackowski | 606/1 |

FOREIGN PATENT DOCUMENTS

| EP | 1 158 306 A2 | 11/2001 |
| JP | A 2006-320069 | 11/2006 |

OTHER PUBLICATIONS

Notification of Transmittal of the International Search Report and the Written Opinion of the International Searching Authority for PCT/IB2008/050468, 13 Pages.

* cited by examiner

*Primary Examiner* — Edward Tso
*Assistant Examiner* — Aaron Piggush
(74) *Attorney, Agent, or Firm* — Patrick B. Horne; Moore & Van Allen, PLLC

(57) ABSTRACT

A system measures a voltage of a battery of a user device, measures a temperature and an acceleration of the battery if a decrease in battery voltage is measured, and determines whether the battery is functioning properly based on one or more of the measured voltage, temperature, or acceleration of the battery.

20 Claims, 5 Drawing Sheets

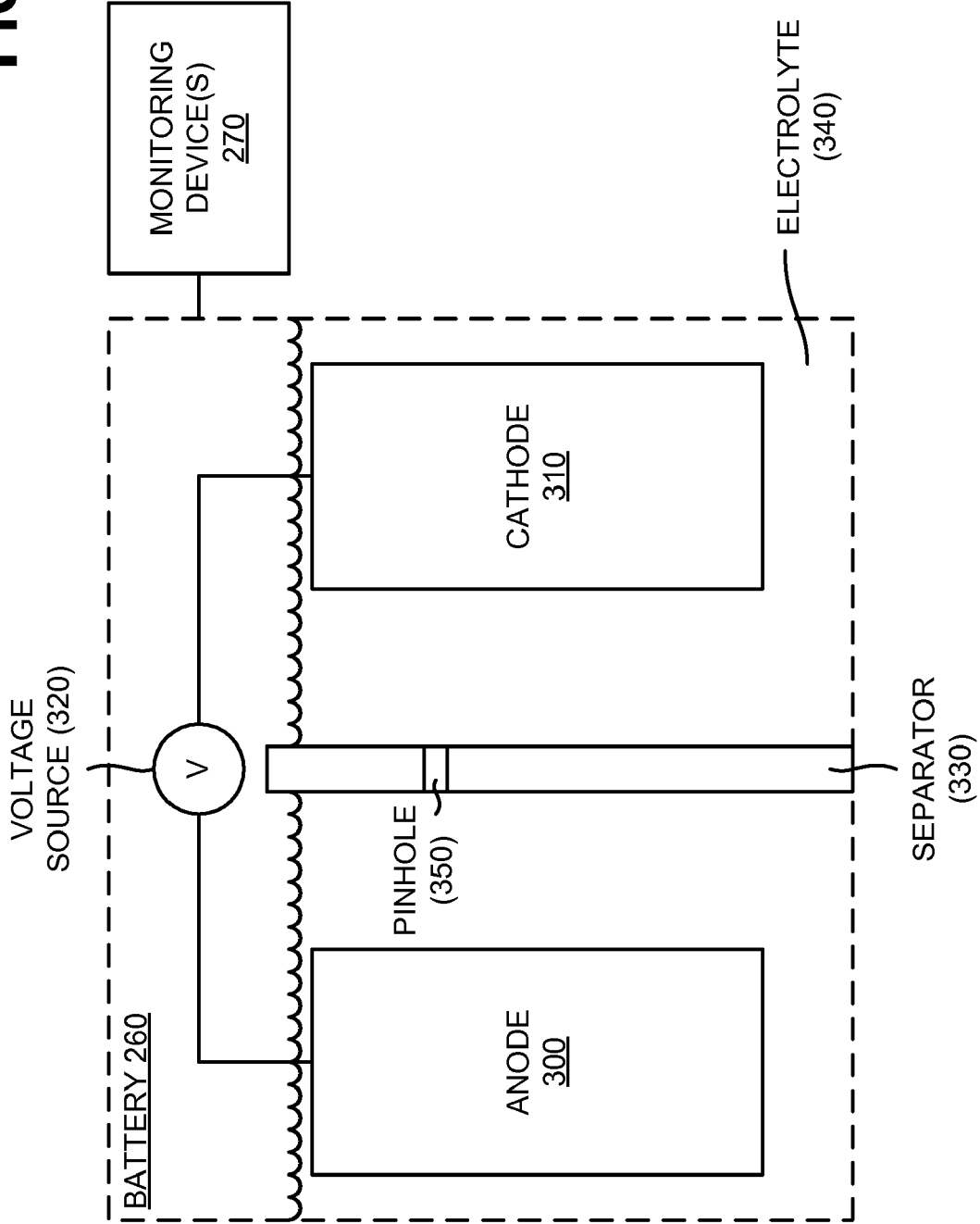

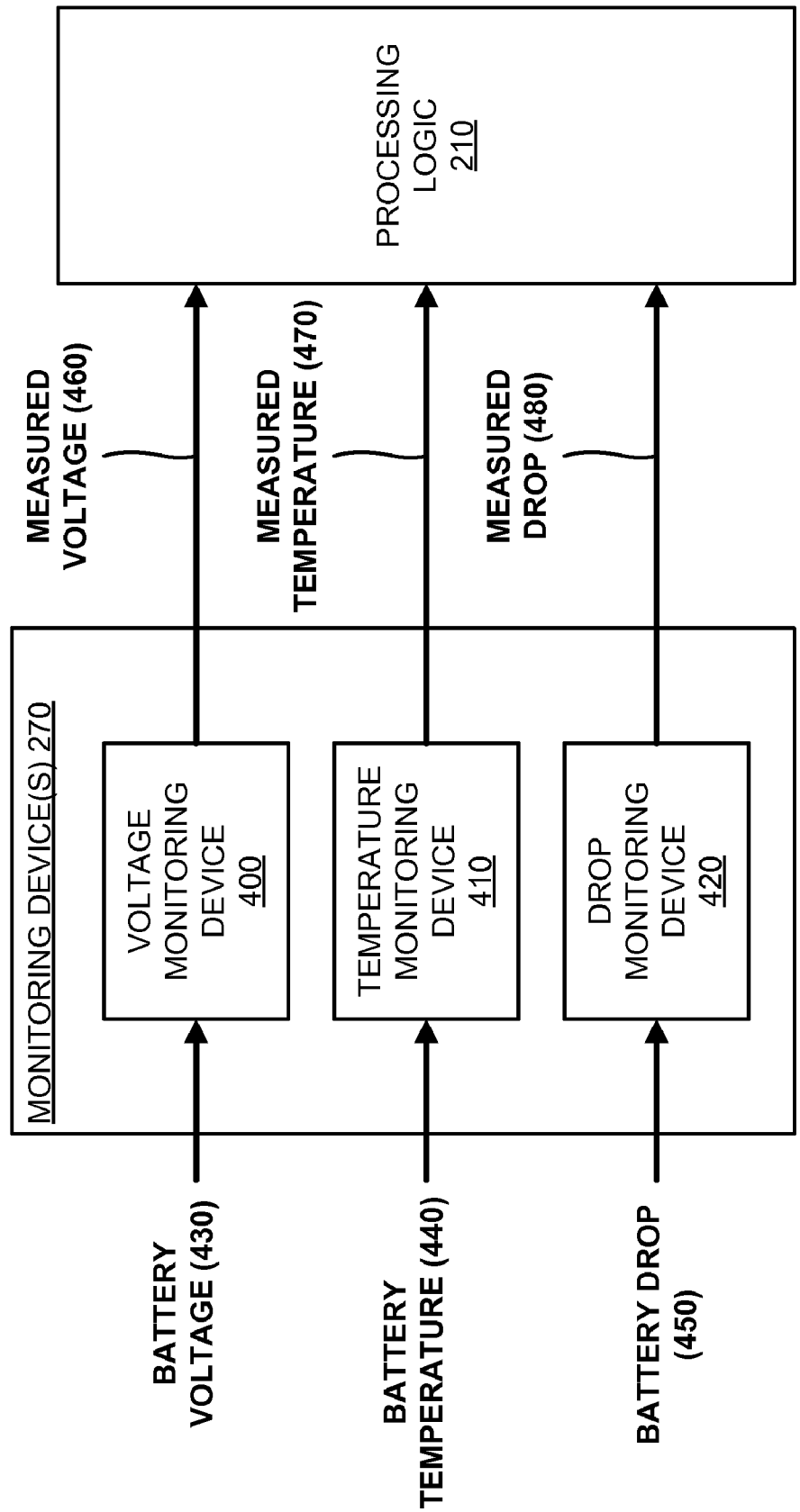

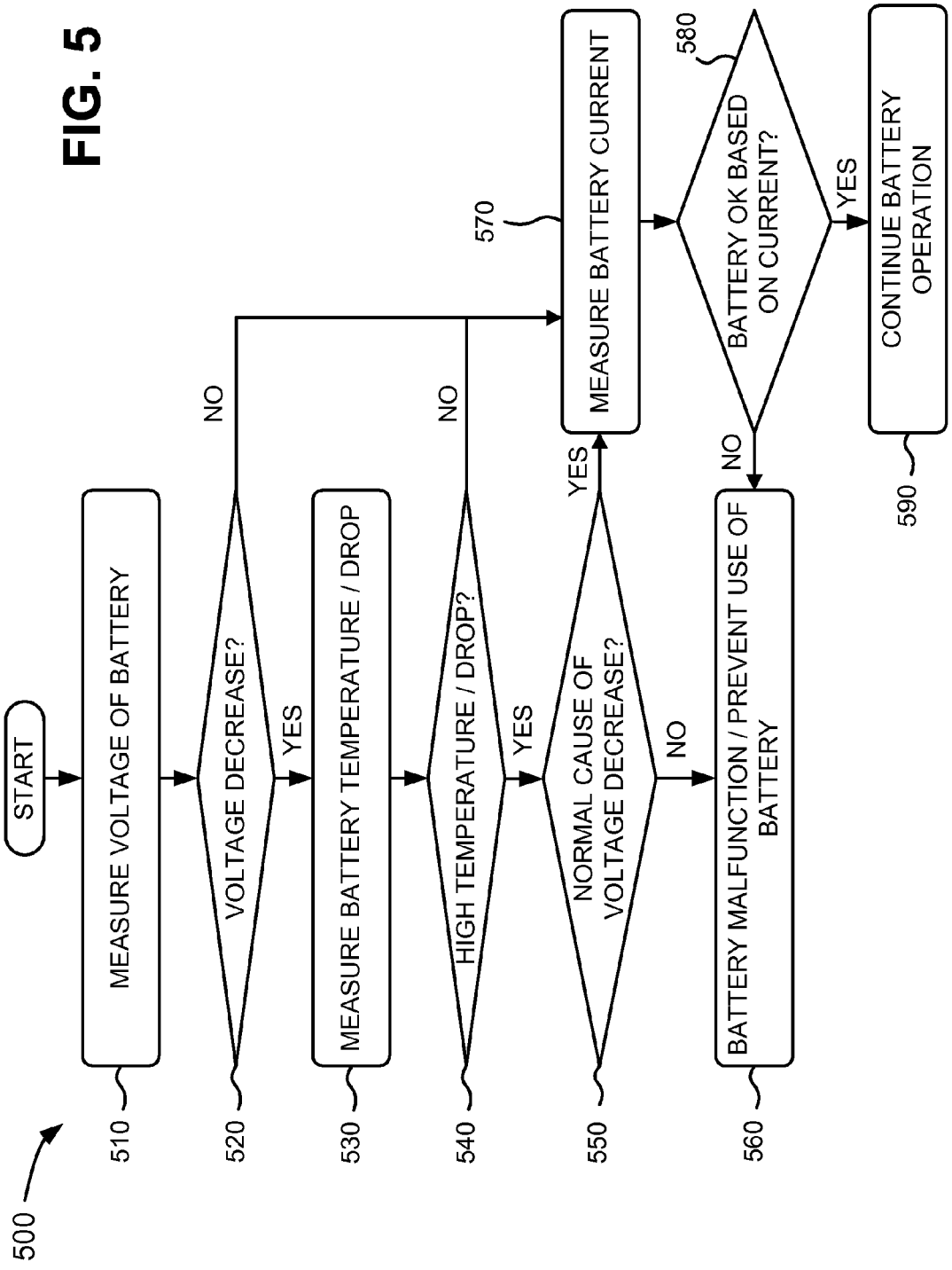

BATTERY SHORT CIRCUIT MONITORING

RELATED APPLICATION

This application claims priority under 35 U.S.C. §119 based on U.S. Provisional Application No. 60/955,103, filed Aug. 10, 2007, the disclosure of which is incorporated by reference herein in its entirety.

BACKGROUND

A lithium-ion (Li-ion) battery is a type of rechargeable battery commonly used in consumer electronic devices (e.g., cell phones, laptop computers, etc.). Lithium-ion batteries are currently one of the most popular types of batteries for portable electronics due to their high energy-to-weight ratios, lack of memory effect, and slow loss of charge when not in use. However, lithium-ion batteries may be susceptible to safety performance issues because of internal short circuits. Recently, millions of lithium-ion batteries in laptop computers were recalled due to a potential risk of internal short circuits caused by microscopic metal particles created during manufacture of the batteries.

SUMMARY

According to one aspect, a method may include measuring a voltage of a battery of a user device, measuring a temperature of the battery and an acceleration of the user device when a decrease in battery voltage is measured, and determining whether the battery is functioning properly based on one or more of the measured voltage, temperature, or acceleration.

Additionally, the method may include preventing use of the battery when the battery is determined to be malfunctioning.

Additionally, the method may include determining if the decrease in battery voltage is caused by operation of the user device, measuring an electrical current of the battery when the decrease in battery voltage is caused by user device operation, and determining whether the battery is functioning properly based on the measured electrical current of the battery.

Additionally, the method may include continuing operation of the battery when the battery is determined to be functioning properly.

Additionally, the method may include determining whether the measured voltage of the battery is greater than a voltage threshold.

Additionally, the method may include determining if the measured temperature of the battery is greater than a temperature threshold, and determining that the battery is malfunctioning when the measured voltage of the battery is greater than the voltage threshold and the measured temperature of the battery is greater than the temperature threshold.

Additionally, the method may include determining if the measured acceleration of the user device is greater than an acceleration threshold, and determining that the battery is malfunctioning when the measured voltage of the battery is greater than the voltage threshold and the measured acceleration of the user device is greater than the acceleration threshold.

According to another aspect, a user device may include a battery, a voltage monitoring device that measures a voltage of the battery, a temperature monitoring device that measures a temperature of the battery when the voltage monitoring device detects a decrease in battery voltage, a mechanical abuse monitoring device that measures mechanical abuse of the battery when the voltage monitoring device detects the decrease in battery voltage, and processing logic configured to determine whether the battery is functioning properly based on one or more of the measured voltage, temperature, or mechanical abuse of the battery.

Additionally, the battery may include one of a lithium-ion battery or a lithium-polymer battery.

Additionally, the battery may include an anode, a cathode, and a separator between the anode and the cathode.

Additionally, one or more of the measured voltage, temperature, or mechanical abuse of the battery may provide an indication of whether the separator includes a pinhole.

Additionally, the voltage monitoring device may include one of a voltmeter, a potentiometer, or an analog-to-digital converter.

Additionally, the temperature monitoring device may include one of a thermometer, a thermocouple, a thermistor, or a resistance temperature detector (RTD).

Additionally, the mechanical abuse monitoring device may include an accelerometer that measures an acceleration of the battery.

Additionally, the acceleration of the battery may provide an indication of whether the user device has been dropped or mechanically abused.

Additionally, the processing logic may be further configured to prevent use of the battery when the battery is determined to be malfunctioning.

Additionally, the processing logic may be further configured to determine if the decrease in battery voltage is caused by operation of the user device, receive a measured electrical current of the battery when the decrease in battery voltage is caused by user device operation, and determine whether the battery is functioning properly based on the measured electrical current of the battery.

Additionally, the processing logic may be further configured to continue operation of the battery when the battery is determined to be functioning properly.

Additionally, the processing logic may be further configured to compare the measured voltage of the battery to a voltage threshold.

Additionally, the processing logic may be further configured to compare the measured temperature of the battery to a temperature threshold, and determine that the battery is malfunctioning when the measured voltage of the battery is greater than the voltage threshold and the measured temperature of the battery is greater than the temperature threshold.

Additionally, the mechanical abuse monitoring device may measure an acceleration of the battery and the processing logic may be further configured to compare the measured acceleration of the battery to an acceleration threshold, and determine that the battery is malfunctioning when the measured voltage of the battery is greater than the voltage threshold and the measured acceleration of the battery is greater than the acceleration threshold.

According to yet another aspect, a system may include means for measuring a voltage of a battery of a user device, means for measuring a temperature and mechanical abuse of the battery when a decrease in battery voltage is measured, means for determining whether the battery is functioning properly based on one or more of the measured voltage, temperature, or acceleration of the battery, and means for preventing use of the battery when the battery is determined to be malfunctioning.

BRIEF DESCRIPTION OF THE DRAWINGS

The accompanying drawings, which are incorporated in and constitute a part of this specification, illustrate one or more implementations described herein and, together with the description, explain these implementations. In the drawings:

FIG. 3 is a diagram of an exemplary battery of the user device depicted in FIGS. 1 and 2;

FIG. 4 is a diagram of monitoring devices of the user device depicted in FIGS. 1 and 2; and FIG. 5 depicts a flow chart of an exemplary process according to implementations described herein.

DETAILED DESCRIPTION

The following detailed description refers to the accompanying drawings. The same reference numbers in different drawings may identify the same or similar elements. Also, the following detailed description does not limit the invention.

Overview

Implementations described herein may provide one or more mechanisms for monitoring a battery (e.g., a lithium-ion battery) of a user device for short circuits. For example, in one implementation, a voltage of a battery may associated with a user device be measured. If a voltage decrease is detected, it may be determined (e.g., measured) if the battery has been exposed to abusive situations such that an internal short circuit may occur. Abusive battery situations may include storing and/or using the battery (e.g., the user device) at too high of a temperature, and/or dropping the battery (e.g., the user device). If an abusive battery situation is detected, future use of the battery may be stopped and/or limited.

Exemplary User Device Configuration

Figure 1:
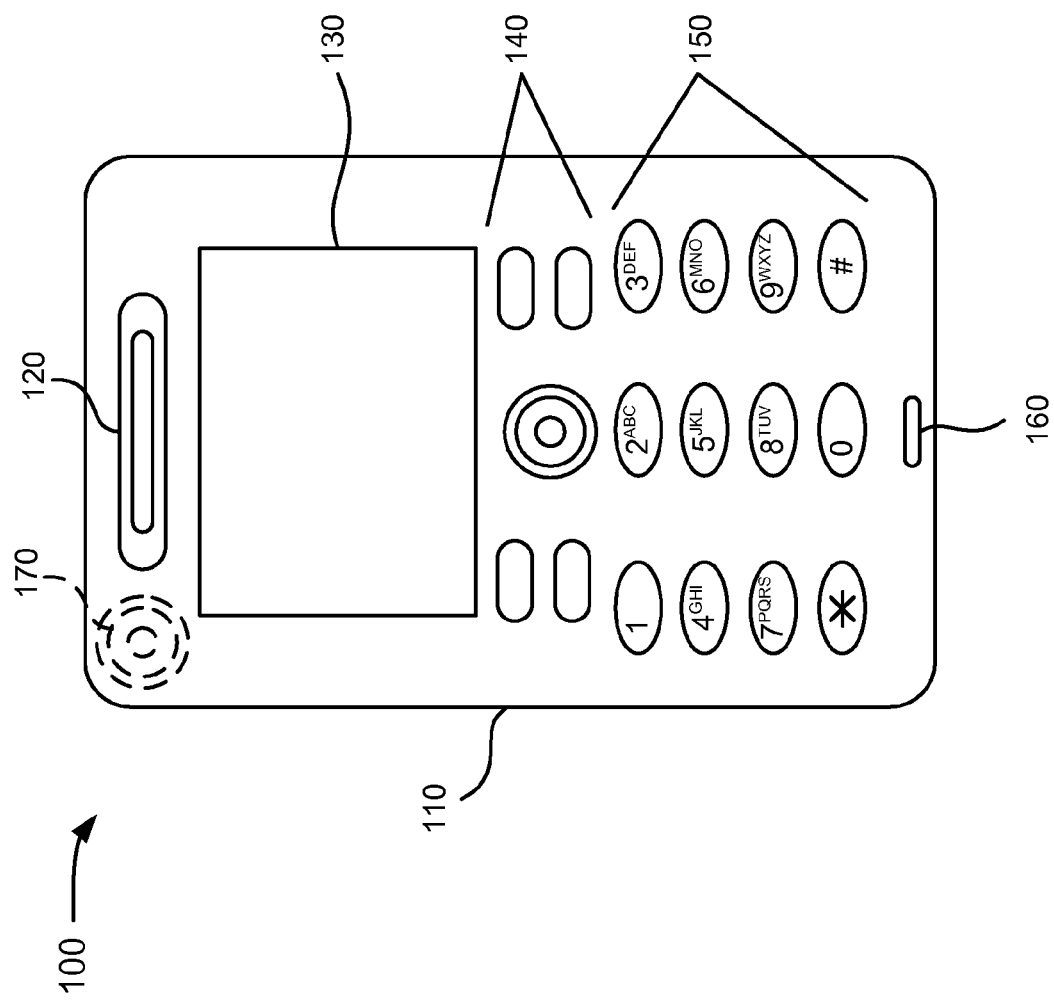
FIG. 1 is an exemplary diagram of a user device in which systems and methods described herein may be implemented.

FIG. 1 is an exemplary diagram of a user device 100 in which systems and methods described herein may be implemented. User device 100 may include any device capable of using a battery, such as a radiotelephone; a personal communications system (PCS) terminal that may combine a cellular radiotelephone with data processing, a facsimile, and data communications capabilities; a personal digital assistant (PDA) that can include a radiotelephone, pager, Internet/intranet access, web browser, organizer, calendar, a Doppler receiver, and/or global positioning system (GPS) receiver; a GPS device; a telephone; a cellular phone; a laptop computer, a personal computer; or another type of computation or communication device, a thread or process running on one of these devices, and/or an object executable by one of these devices. In one implementation, user device 100 may include a lithium-ion battery and/or a lithium-polymer battery.

As shown in FIG. 1, user device 100 may include a housing 110, a speaker 120, a display 130, control buttons 140, a keypad 150, a microphone 160, and/or a camera 170. Housing 110 may protect the components of user device 100 from outside elements. Speaker 120 may provide audible information to a user of user device 100.

Display 130 may provide visual information to the user. For example, display 130 may display text input into user device 100, text, images, video, and/or graphics received from another device, and/or information regarding incoming or outgoing calls or text messages, emails, media, games, phone books, address books, the current time, etc. Control buttons 140 may permit the user to interact with user device 100 to cause user device 100 to perform one or more operations. For example, control buttons 140 may be used to cause user device 100 to transmit information. Keypad 150 may include a standard telephone keypad. Microphone 160 may receive audible information from the user. Camera 170 may be provided on a back side of user device 100, and may enable user device 100 to capture and/or store video and/or images (e.g., pictures).

Although FIG. 1 shows exemplary components of user device 100, in other implementations, user device 100 may contain fewer, different, or additional components than depicted in FIG. 1. In still other implementations, one or more components of user device 100 may perform one or more other tasks performed by one or more other components of user device 100.

Figure 2:
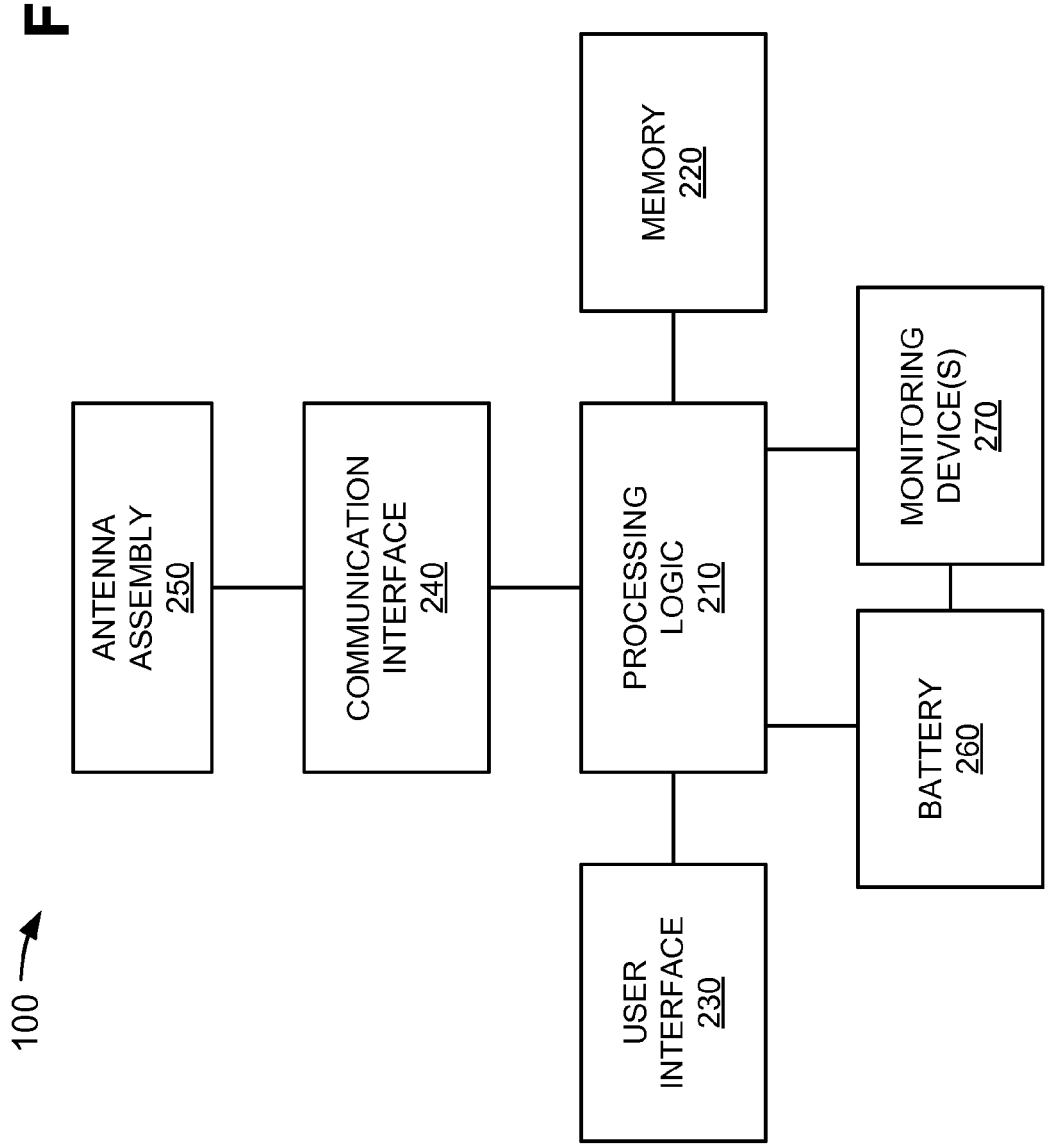
FIG. 2 is a diagram of exemplary components of the user device of FIG. 1.

FIG. 2 is a diagram of exemplary components of user device 100. As illustrated, user device 100 may include processing logic 210, memory 220, a user interface 230, a communication interface 240, an antenna assembly 250, a battery 260, and/or one or more monitoring devices 270. Processing logic 210 may include a processor, a microprocessor, an application specific integrated circuit (ASIC), a field programmable gate array (FPGA), or the like. Processing logic 210 may control overall operation of user device 100 and its components. Memory 220 may include a random access memory (RAM), a read-only memory (ROM), and/or another type of memory to store data and instructions that may be used by processing logic 210.

User interface 230 may include mechanisms for inputting information to user device 100 and/or for outputting information from user device 100. Examples of input and output mechanisms might include buttons (e.g., control buttons 140, keys of keypad 150, a joystick, etc.) or a touch screen interface to permit data and control commands to be input into user device 100; a speaker (e.g., speaker 120) to receive electrical signals and output audio signals; a microphone (e.g., microphone 160) to receive audio signals and output electrical signals; a display (e.g., display 130) to output visual information (e.g., text input into user device 100); a vibrator to cause user device 100 to vibrate; and/or a camera (e.g., camera 170) to receive video and/or images.

Communication interface 240 may include, for example, a transmitter that may convert baseband signals from processing logic 110 to radio frequency (RF) signals and/or a receiver that may convert RF signals to baseband signals. Alternatively, communication interface 240 may include a transceiver to perform functions of both a transmitter and a receiver. Communication interface 240 may connect to antenna assembly 250 for transmission and/or reception of the RF signals. Antenna assembly 250 may include one or more antennas to transmit and/or receive RF signals over the air. Antenna assembly 250 may, for example, receive RF signals from communication interface 240 and transmit them over the air, and receive RF signals over the air and provide them to communication interface 240. In one implementation, for example, communication interface 240 may communicate with a network and/or devices connected to a network.

As will be described in detail below, user device 100 may perform certain operations described herein in response to processing logic 210 executing software instructions of an application contained in a computer-readable medium, such as memory 220. A computer-readable medium may be defined as a physical or logical memory device. The software instructions may be read into memory 220 from another computer-readable medium or from another device via communication interface 240. The software instructions contained in memory 220 may cause processing logic 210 to perform processes that will be described later. Alternatively, hardwired circuitry may be used in place of or in combination with software instructions to implement processes described herein. Thus, implementations described herein are not limited to any specific combination of hardware circuitry and software.

Battery 260 may include any battery that has a membrane (e.g., a separator) separating positive and negative electrodes (e.g., a lithium-ion battery, a lithium-polymer battery, etc.). Battery 260 may include a variety of shapes and sizes, depending on the shape and size of user device 100, the amount of power required by user device 100, etc. Further details of battery 260 are provided below in connection with FIG. 3.

Monitoring device(s) 270 may include any device capable of monitoring conditions of battery 260 and/or conditions that may affect performance of battery 260. For example, in one implementation, monitoring device(s) 270 may include a voltage monitoring device (e.g., a voltage sensor, such as an analog-to-digital (A/D) converter provided within user device 100), a temperature monitoring device (e.g., a thermistor, a thermocouple, etc.), and/or a drop monitoring device (e.g., an accelerometer, etc.). Further details of monitoring device(s) 270 are provided below in connection with FIG. 4.

Although FIG. 2 shows exemplary components of user device 100, in other implementations, user device 100 may contain fewer, different, or additional components than depicted in FIG. 2. In still other implementations, one or more components of user device 100 may perform one or more other tasks performed by one or more other components of user device 100.

Exemplary Battery

FIG. 3 is an exemplary diagram of battery 260. As illustrated, battery 260 may communicate with monitoring device(s) 270, and may include an anode 300, a cathode 310, a voltage source 320, a separator 330, and/or an electrolyte 340. In one implementation, battery 260 may provide power to other components of user device 100 (e.g., processing logic 210, memory 220, user interface 230, communication interface 240, antenna assembly 250, and/or monitoring device(s) 270).

In one implementation, anode 300 may include an electrode through which positive electric current flows into a polarized electrical device. If battery 260 is discharging, anode 300 may form a negative terminal into which the positive electric current flows. This inwardly flowing current may be carried internally by positive ions moving into electrolyte 340 from anode 300. If battery 260 is recharging, anode 300 may form a positive terminal that receives current from an external generator (e.g., voltage source 320). Anode 300 may be made of a variety of shapes and sizes, depending on the shape and size of battery 260, and may be made from a variety of materials. In one exemplary implementation, battery 260 may include a lithium-ion battery, and anode 300 may be made from carbon.

Cathode 310 may include an electrode through which positive electric current flows out of a polarized electrical device. If battery 260 is discharging, cathode 310 may form a positive terminal from which the positive electric current flows. This outwardly flowing current may be carried internally by positive ions moving from electrolyte 340 into cathode 310. If battery 260 is recharging, cathode 310 may form a negative terminal that sends current to an external generator (e.g., voltage source 320). Cathode 310 may be made of a variety of shapes and sizes, depending on the shape and size of battery 260, and may be made from a variety of materials. In one exemplary implementation, battery 260 may include a lithium-ion battery, and cathode 310 may be made from a metal oxide.

Separator 330 may separate anode 300 and cathode 310, and may include a membrane (e.g., a microporous membrane). Separator 330 may be made of a variety of shapes and sizes, depending on the shape and size of battery 260. For example, in one implementation, if battery 260 is used for a laptop computer (e.g., user device 100), separator 330 may include a thickness of less than or equal to twenty-five (25) micrometers (μm). Over the years, separator 330 thickness (e.g., in lithium-ion batteries) has been made smaller and smaller based on materials development and/or demand for higher capacity. Separator 330 may be made from a variety of materials, such as a polyolefin-based microporous membrane and/or any other material compatible with other materials or chemicals used in battery 260 (e.g., chemicals used for electrolyte 340).

Electrolyte 340 may include any liquid substance which acts as a medium to conduct electricity between anode 300 and cathode 310 (e.g., plates of battery 260), and to store energy on anode 300 and cathode 310. Electrolyte 340 may depend on the type and purpose of battery 260. For example, if battery 260 is a lithium-ion battery, electrolyte 340 may include an organic electrolyte that freezes at much lower temperatures than more traditional water-based electrolytes. In one exemplary implementation, electrolyte 340 may include a lithium salt in an organic solvent. In such an implementation, if anode 300 is made from carbon and cathode 310 is made from a metal oxide (M) (e.g., such as cobalt), the underlying chemical reaction that may permit battery 260 to provide electricity may be described as follows:

$$Li_{1-x}MO_2 + Li_xC_6 \Leftrightarrow C_6 + LiMO_2$$

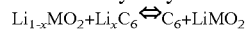

As further shown in FIG. 3, a pinhole 350 (e.g., micro-short circuit or local breakdown) may occur in separator 330. Micro-short circuits such as pinhole 350 may be caused by a variety of conditions. For example, pinhole 350 may occur if battery 260 (and/or user device 100) is stored and/or used at too high of temperature (e.g., a temperature greater than or equal to sixty (60) degrees Celsius). In another example, pinhole 350 may occur if battery 260 (and/or user device 100) is subjected to mechanical abuse (e.g., user device 100 is dropped, struck, etc.). The internal micro-short circuits (e.g., pinhole 350) that such conditions may cause may be unpredictable, and may not harm battery 260. However, such micro-short circuits (e.g., pinhole 350) may cause battery 260 to experience thermal run-away (e.g., an internal short circuit current may result in a (local) temperature increase which, in turn, may trigger (exothermic) chemical reactions that may lead to thermal runaway of battery 260), and may cause battery 260 to become dangerously hot. In order to prevent any health and safety issues associated with such micro-short circuits, in one implementation described below in connection with FIGS. 4 and 5, use of battery 260 may be prevented and/or limited if battery 260 is subjected to abusive conditions (e.g., excessive heat and/or mechanical abuse).

Although FIG. 3 shows exemplary components of battery 260, in other implementations, battery 260 may contain fewer, different, or additional components than depicted in FIG. 3. In still other implementations, one or more components of battery 260 may perform one or more other tasks performed by one or more other components of battery 260.

Exemplary Monitoring Devices

FIG. 4 is an exemplary diagram of monitoring device(s) 270. As illustrated, monitoring device(s) 270 may include a voltage monitoring device 400, a temperature monitoring device 410, and/or a drop monitoring device 420.

Voltage monitoring device 400 may include any device capable of measuring voltage of battery 260. For example, in one implementation, voltage monitoring device 400 may include a voltmeter, a potentiometer, an A/D converter provided within user device 100, etc. In other implementations, voltage monitoring device 400 may include other components of user device 100 that are capable of measuring voltage of battery 260, such as processing logic 210. As further shown in FIG. 4, voltage monitoring device 400 may measure a battery voltage 430, and may output a measured voltage 460 to processing logic 210. Processing logic 210 may utilize measured voltage 460 as described below in connection with FIG. 5.

Temperature monitoring device 410 may include any device capable of measuring temperature of battery 260 and/or user device 100. For example, in one implementation, temperature monitoring device 410 may include a thermometer, a thermocouple, a thermistor, a resistance temperature detector (RTD), etc. As further shown in FIG. 4, temperature monitoring device 410 may measure a battery temperature 440 (or a temperature of user device 100), and may output a measured temperature 470 to processing logic 210. Processing logic 210 may utilize measured temperature 470 as described below in connection with FIG. 5.

Drop monitoring device 420 may include any device capable of measuring various mechanical conditions (e.g., dropping, shaking, striking, etc.) of battery 260 and/or user device 100. For example, in one implementation, drop monitoring device 420 may include an accelerometer, a Doppler receiver, a GPS receiver, etc. As further shown in FIG. 4, drop monitoring device 420 may measure a battery drop 450 (or a drop of user device 100), and may output a measured drop 480 to processing logic 210. Processing logic 210 may utilize measured drop 480 as described below in connection with FIG. 5.

Although FIG. 4 shows exemplary components of monitoring device(s) 270, in other implementations, monitoring device(s) 270 may contain fewer, different, or additional components than depicted in FIG. 4. In still other implementations, one or more components of monitoring device(s) 270 may perform one or more other tasks performed by one or more other components of monitoring device(s) 270.

Exemplary Process

FIG. 5 depicts a flow chart of an exemplary process 500 according to implementations described herein. In one implementation, process 500 may be performed by hardware and/or software components of user device 100 (e.g., processing logic 210). In other implementations, process 500 may be performed by hardware and/or software components of user device 100 (e.g., processing logic 210) in combination with hardware and/or software components of another device (e.g., communicating with user device 100 via communication interface 240).

As shown, process 500 may begin with a voltage measurement of a battery of a user device (block 510) and a determination of whether the battery voltage decreased (block 520). For example, in one implementation described above in connection with FIG. 4, voltage monitoring device 400 may measure battery voltage 430, and may output measured voltage 460 to processing logic 210. Processing logic 210 may determine whether the voltage of battery 260 has decreased (e.g., more than a threshold) over a period of time (e.g., minutes, hours, etc.). A sudden decrease in battery voltage 430 may indicate that battery 260 is/was subjected to an abusive condition (e.g., excessive temperatures, mechanical abuse, etc.), and that a micro-short circuit (e.g., pinhole 350) may have been created in separator 330.

Returning to FIG. 5, if a battery voltage decrease is detected (block 520—YES), a temperature of the battery and/or whether the battery was subjected to mechanical abuse may be measured (block 530). For example, in one implementation described above in connection with FIG. 4, temperature monitoring device 410 may measure battery temperature 440 (or a temperature of user device 100), and may output measured temperature 470 to processing logic 210. Drop monitoring device 420 may measure battery drop 450 (or a drop of user device 100), and may output measured drop 480 to processing logic 210. Processing logic 210 may utilize measured temperature 470 and measured drop 480 to determine whether measured temperature 470 and/or measured drop 480 are significant enough (e.g., greater than respective thresholds) to create a micro-short circuit (e.g., pinhole 350) in separator 330.

As further shown in FIG. 5, if the measured temperature of battery is greater than a predetermined threshold and/or the battery was subjected to mechanical abuse as determined by processing logic upon receipt of measured drop 480 (block 540—YES), it may be determined whether the battery voltage decrease was caused by a normal operating condition of the user device (block 550). For example, in one implementation, processing logic 210 of user device 100 may determine if a sudden decrease in battery voltage 430 was caused by a normal operating condition (e.g., text messaging, paging, powering display 130, using camera 270, displaying video and/or images, etc.) of user device 110. Processing logic 210 may disregard or filter a sudden decrease in battery voltage 430 (caused by normal operating conditions) as being a potential cause of micro-short circuits in separator 330.

Returning to FIG. 5, if the battery voltage decrease was not caused by a normal operating condition of the user device (block 550—NO), it may be determined that the battery is malfunctioning and further use of the battery may be prevented (block 560). For example, in one implementation, processing logic 210 of user device 100 may determine that the sudden decrease in battery voltage 430 was not caused by a normal operating condition, but rather was caused by an abusive condition (e.g., excessive heat, mechanical abuse, etc.). Processing logic 210 may thus determine that battery 260 is malfunctioning, and may prevent further use of battery 260 (e.g., processing logic 210 may instruct battery 260 to shut down). In other implementations, processing logic 210 may limit use of battery 260, rather than prevent use of battery 260. For example, a charging cycle for battery 260 may be reduced, and/or voltage output by battery 260 may be reduced. In still other implementations, processing logic 210 may alternatively and/or additionally initiate a separate test protocol designed to check the status of battery 260.

As further shown in FIG. 5, if no voltage decrease is detected (block 520—NO), the measured temperature of battery is not high and/or the battery was not subjected to mechanical abuse (block 540—NO), and/or the battery voltage decrease was caused by a normal operating condition of the user device (block 550—YES), then an electrical current of the battery may be measured (block 570) and it may be determined if the battery is functioning properly based on the measured current (block 580). For example, in one implementation, if processing logic 210 determines that there was no voltage decrease of battery 260, that battery was not subjected to abusive conditions (e.g., excessive heat, mechanical abuse, etc.), and/or that the battery voltage decrease was caused by a normal operating condition of user device 100, then an electrical current of battery 260 may be measured (e.g., with a sense resistor, an A/D converter provided within user device 100, etc.). Processing logic 210 may determine whether battery 260 is functioning properly based on the measured current. In one example, processing logic 210 may compare the measured current of battery 260 to a threshold in order to determine if battery 260 is functioning properly.

Returning to FIG. 5, if the battery is determined to not be functioning properly based on the measured battery current (block 580—NO), it may be determined that the battery is malfunctioning and further use of the battery may be prevented or restricted (block 560), as described above. If the battery is determined to be functioning properly based on the measured battery current (block 580—YES), then the battery operation may be continued (block 590). For example, in one implementation, processing logic 210 may determine that battery 260 is functioning properly based on the measured current. Processing logic 210 may thus determine that there are no significant micro-short circuits (e.g., pinhole 350) in separator 330, and that battery 260 may continue to be safely operated by user device 100.

Conclusion

Implementations described herein may provide one or more mechanisms for monitoring a battery of a user device for short circuits. For example, in one implementation, a voltage of a user device's battery may be measured. If a voltage decrease is detected, it may be determined if the battery has been exposed to abusive situations such that a short circuit may occur. Abusive battery situations may include storing and/or using the battery at too high of a temperature, and/or mechanically abusing (e.g., dropping) the battery. If an abusive battery situation is detected, future use of the battery may be stopped and/or limited.

The foregoing description of implementations provides illustration and description, but is not intended to be exhaustive or to limit the invention to the precise form disclosed. Modifications and variations are possible in light of the above teachings or may be acquired from practice of the invention. For example, while a series of blocks has been described with regard to FIG. 5, the order of the blocks may be modified in other implementations. Further, non-dependent blocks may be performed in parallel.

It should be emphasized that the term "comprises/comprising" when used in the this specification is taken to specify the presence of stated features, integers, steps or components but does not preclude the presence or addition of one or more other features, integers, steps, components or groups thereof.

It will be apparent that aspects, as described above, may be implemented in many different forms of software, firmware, and hardware in the implementations illustrated in the figures. The actual software code or specialized control hardware used to implement these aspects should not be construed as limiting. Thus, the operation and behavior of the aspects were described without reference to the specific software code—it being understood that software and control hardware could be designed to implement the aspects based on the description herein.

Even though particular combinations of features are recited in the claims and/or disclosed in the specification, these combinations are not intended to limit the invention. In fact, many of these features may be combined in ways not specifically recited in the claims and/or disclosed in the specification.

No element, block, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A method, comprising:
   measuring a voltage of a battery of a user device at a first time;
   measuring a voltage of a battery of a user device at a second time after the first time
   determining a difference between the voltage measured at the first time with a voltage measured at the second time;
   determining whether the difference is greater than a predetermined threshold;
   measuring a temperature of the battery and an acceleration of the user device in response to the determination that the difference is greater than the predetermined threshold; and
   determining whether the battery is functioning properly based on one or more of the measured voltage, temperature, or acceleration.

2. The method of claim 1, further comprising:
   preventing use of the battery when the battery is determined to be malfunctioning.

3. The method of claim 1, further comprising:
   determining when the decrease in battery voltage is caused by operation of the user device;
   measuring an electrical current of the battery when the decrease in battery voltage is caused by user device operation; and
   determining whether the battery is functioning properly based on the measured electrical current of the battery.

4. The method of claim 3, further comprising:
   continuing operation of the battery when the battery is determined to be functioning properly.

5. The method of claim 1, further comprising:
   determining when the measured temperature of the battery is greater than a temperature threshold; and
   determining that the battery is malfunctioning when the measured voltage of the battery is greater than the voltage threshold and the measured temperature of the battery is greater than the temperature threshold.

6. The method of claim 1, further comprising:
   determining when the measured acceleration of the user device is greater than an acceleration threshold; and
   determining that the battery is malfunctioning when the measured voltage of the battery is greater than the voltage threshold and the measured acceleration of the user device is greater than the acceleration threshold.

7. A user device, comprising:
   a battery;
   a voltage monitoring device that measures a voltage of the battery at a first time and at a second time after the first time;
   processing logic to determine a difference between the voltage measured at the first time with a voltage measured at the second time and to determine whether the difference is greater than a predetermined threshold;
   a temperature monitoring device that measures a temperature of the battery in response to the voltage monitoring device determining that the difference is greater than the predetermined threshold;
   a mechanical abuse monitoring device that measures mechanical abuse of the battery in response to the voltage monitoring device determining that the difference is greater than the predetermined threshold; and wherein the processing logic further to determine whether the battery is functioning properly based on one or more of the measured voltage, temperature, or mechanical abuse of the battery.

8. The user device of claim 7, where the battery includes one of a lithium-ion battery or a lithium-polymer battery.

9. The user device of claim 7, where the battery comprises:
an anode;
a cathode; and
a separator between the anode and the cathode.

10. The user device of claim 9, where one or more of the measured voltage, temperature, or mechanical abuse of the battery provides an indication of whether the separator includes a pinhole.

11. The user device of claim 7, where the voltage monitoring device includes one of:
a voltmeter;
a potentiometer; or
an analog-to-digital converter.

12. The user device of claim 7, where the temperature monitoring device includes one of:
a thermometer;
a thermocouple;
a thermistor; or
a resistance temperature detector (RTD).

13. The user device of claim 9, where the mechanical abuse monitoring device comprises an accelerometer that measures an acceleration of the battery.

14. The user device of claim 13, where the acceleration of the battery provides an indication of whether the user device has been dropped or mechanically abused.

15. The user device of claim 7, where the processing logic is further to:
prevent use of the battery when the battery is determined to be malfunctioning.

16. The user device of claim 7, where the processing logic is further to:
determine when the decrease in battery voltage is caused by operation of the user device;
receive a measured electrical current of the battery when the decrease in battery voltage is caused by user device operation; and
determine whether the battery is functioning properly based on the measured electrical current of the battery.

17. The user device of claim 16, where the processing logic is further to:
continue operation of the battery when the battery is determined to be functioning properly.

18. The device of claim 7, where the processing logic is further to:
compare the measured temperature of the battery to a temperature threshold; and
determine that the battery is malfunctioning when the measured voltage of the battery is greater than the voltage threshold and the measured temperature of the battery is greater than the temperature threshold.

19. The user device of claim 7, where the mechanical abuse monitoring device measures an acceleration of the battery and the processing logic is further to:
compare the measured acceleration of the battery to an acceleration threshold; and
determine that the battery is malfunctioning when the measured voltage of the battery is greater than the voltage threshold and the measured acceleration of the battery is greater than the acceleration threshold.

20. A system, comprising:
means for measuring a voltage of a battery of a user device at a first time and at a second time after the first time;
means for determining a difference between the voltage measured at the first time with a voltage measured at the second time;
means for determining whether the difference is greater than a predetermined threshold;
means for measuring a temperature and mechanical abuse of the battery in response to the determination that the difference is greater than the predetermined threshold;
means for determining whether the battery is functioning properly based on one or more of the measured voltage, temperature, or mechanical abuse of the battery; and
means for preventing use of the battery when the battery is determined to be malfunctioning.

* * * * *